United States Patent
Salter et al.

(10) Patent No.: US 10,525,912 B2
(45) Date of Patent: Jan. 7, 2020

(54) CAPACITIVE PROXIMITY SENSORS OF VEHICLE DOORS

(71) Applicant: Ford Global Technologies, LLC, Dearborn, MI (US)

(72) Inventors: Stuart C. Salter, White Lake, MI (US); Paul Kenneth Dellock, Northville, MI (US); James J. Surman, Clinton Township, MI (US); Richard Gall, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 1 day.

(21) Appl. No.: 15/951,898

(22) Filed: Apr. 12, 2018

(65) Prior Publication Data

US 2019/0315294 A1   Oct. 17, 2019

(51) Int. Cl.
*B60R 16/023* (2006.01)
*G01B 7/00* (2006.01)
*B60R 16/027* (2006.01)
*B60J 5/00* (2006.01)

(52) U.S. Cl.
CPC .......... *B60R 16/0232* (2013.01); *B60J 5/00* (2013.01); *B60R 16/027* (2013.01); *G01B 7/003* (2013.01)

(58) Field of Classification Search
CPC ... B60R 16/0232; B60R 16/027; G01B 7/003; B60J 5/00
USPC .......................................................... 701/49
See application file for complete search history.

(56) References Cited

U.S. PATENT DOCUMENTS

| | | | |
|---|---|---|---|
| 6,848,310 | B2 | 2/2005 | Goto |
| 2003/0071727 | A1* | 4/2003 | Haag .................... H03K 17/955 340/562 |
| 2005/0068712 | A1* | 3/2005 | Schulz .................... E05B 81/78 361/287 |
| 2008/0122456 | A1 | 5/2008 | Moon et al. |
| 2008/0297176 | A1 | 12/2008 | Douglas |
| 2015/0002175 | A1 | 1/2015 | Van Gastel |

FOREIGN PATENT DOCUMENTS

| | | |
|---|---|---|
| GB | 2376075 A | 4/2002 |
| WO | WO 2006/092627 A1 | 9/2006 |
| WO | WO 2013/018264 A1 | 12/2013 |

OTHER PUBLICATIONS

Atmel, *Touch Sensors Design Guide*, Apr. 2009, 72 pages.

* cited by examiner

*Primary Examiner* — Brian P Sweeney
(74) *Attorney, Agent, or Firm* — Frank Lollo; Eversheds Sutherland (US) LLP

(57) ABSTRACT

Method and apparatus are disclosed for capacitive proximity sensors of vehicle doors. An example vehicle includes an outer surface layer, sheet metal for providing rigidity, a low dielectric layer, and a capacitive sensor. The capacitive sensor includes a receiving layer positioned between the outer surface layer and the low dielectric layer and the sheet metal that functions as a transmitting layer. The low dielectric layer separates the receiving layer and the sheet metal.

18 Claims, 4 Drawing Sheets

CAPACITIVE PROXIMITY SENSORS OF VEHICLE DOORS

TECHNICAL FIELD

The present disclosure generally relates to capacitive sensors and, more specifically, to capacitive proximity sensors of vehicle doors.

BACKGROUND

Oftentimes, vehicles include one or more systems that perform vehicle functions automatically. For instance, some vehicles include cruise control systems that autonomously control a speed at which a vehicle travels based upon a target speed set by an operator of a vehicle (e.g., a driver). Some vehicles include park-assist systems that enable a vehicle to be autonomously or semi-autonomously parked into an available parking spot. Further, some vehicles include door systems that automatically open and/or close one or more doors of the vehicle upon receiving an instruction to do so (e.g., from a driver and/or other user of the vehicle).

SUMMARY

The appended claims define this application. The present disclosure summarizes aspects of the embodiments and should not be used to limit the claims. Other implementations are contemplated in accordance with the techniques described herein, as will be apparent to one having ordinary skill in the art upon examination of the following drawings and detailed description, and these implementations are intended to be within the scope of this application.

Example embodiments are shown for capacitive proximity sensors of vehicle doors. An example disclosed vehicle includes an outer surface layer, sheet metal for providing rigidity, a low dielectric layer, and a capacitive sensor. The capacitive sensor includes a receiving layer positioned between the outer surface layer and the low dielectric layer and the sheet metal that functions as a transmitting layer. The low dielectric layer separates the receiving layer and the sheet metal.

In some examples, the sheet metal of the door is grounded. In some examples, the low dielectric layer includes ribs that define air pockets positioned between the receiving layer and the sheet metal. In some examples, a detection range of the capacitive sensor corresponds with a distance between the receiving layer and the sheet metal.

Some examples further include a door motor for opening and closing the door and a door control unit for controlling actuation of the door motor. In some such examples, the door control unit is configured to stop opening of the door in response to the capacitive sensor detecting an object near the door.

An example disclosed door of a vehicle includes an outer surface layer, sheet metal for providing rigidity, a low dielectric layer, and a capacitive proximity sensor. The capacitive proximity sensor includes a receiving layer positioned between the outer surface layer and the low dielectric layer and the sheet metal that functions as a transmitting layer. The low dielectric layer separates the receiving layer and the sheet metal.

In some examples, the outer surface layer is a thin layer of high dielectric material that increases a sensitivity factor of an electric field of the receiving layer. In some examples, the outer surface layer includes rubber to protect the receiving layer of the capacitive proximity sensor from damage. In some examples, the outer surface layer is a thermoplastic olefin layer.

In some examples, the sheet metal is grounded. In some examples, a detection range of the capacitive proximity sensor corresponds with a distance between the receiving layer and the sheet metal.

In some examples, the low dielectric layer includes ribs that define air pockets positioned between the receiving layer and the sheet metal. In some such examples, the ribs extend in a direction between the receiving layer and the sheet metal. In some such examples, the ribs reduce an amount of material of the low dielectric layer utilized to space apart the receiving layer and the sheet metal. In some such examples, the air pockets defined by the ribs reduce conductivity between the receiving layer and the sheet metal. In some such examples, the ribs include distal ends that contact the sheet metal to reduce conductivity between the receiving layer and the sheet metal by reducing a contact surface area between the low dielectric layer and the sheet metal.

Some examples further include a grid of a plurality of capacitive proximity sensors to facilitate detection of a nearby object. Some such examples further include a capacitive module that is electrically coupled to each of the plurality of capacitive proximity sensors. In some such examples, the capacitive module is grounded to a weld stud coupled to the sheet metal to reduce an effect of noise on the plurality of capacitive proximity sensors.

BRIEF DESCRIPTION OF THE DRAWINGS

For a better understanding of the invention, reference may be made to embodiments shown in the following drawings. The components in the drawings are not necessarily to scale and related elements may be omitted, or in some instances proportions may have been exaggerated, so as to emphasize and clearly illustrate the novel features described herein. In addition, system components can be variously arranged, as known in the art. Further, in the drawings, like reference numerals designate corresponding parts throughout the several views.

DETAILED DESCRIPTION OF EXAMPLE EMBODIMENTS

Figure 1:
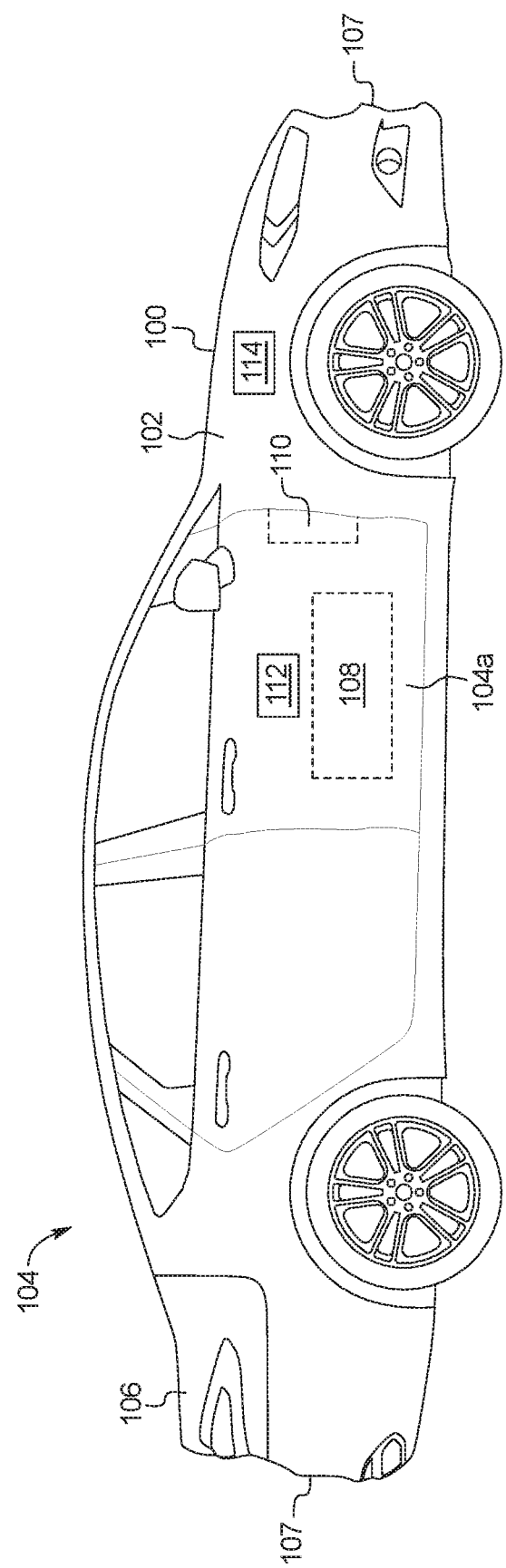
FIG. 1 illustrates an example vehicle in accordance with the teachings herein.

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

Oftentimes, vehicles include one or more systems that perform vehicle functions automatically. For instance, some vehicles include cruise control systems that autonomously control a speed at which a vehicle travels based upon a target speed set by an operator of a vehicle (e.g., a driver). Some vehicles include park-assist systems that enable a vehicle to be autonomously or semi-autonomously parked into an available parking spot. Further, some vehicles include door systems that automatically open and/or close one or more doors of the vehicle upon receiving an instruction to do so (e.g., from a driver and/or other user of the vehicle). In some such instances, the door system potentially may open a door into a nearby object (e.g., another vehicle, a person, a wall).

Example apparatus disclosed herein include capacitive sensor(s) that enable an automatic door system to avoid opening a vehicle door into nearby object(s) by detecting a presence and/or located of the nearby object(s). Examples disclosed herein include a capacitive sensor within a door panel of a vehicle that is configured to detect nearby objects for automatic door opening systems. The capacitive sensor includes an X-electrode and a Y-electrode. The X-electrode is formed from sheet metal of the door panel. The Y-electrode is formed from a sensor that is placed between an inner layer (e.g., a low dielectric layer) and an outer layer (e.g., an outer surface layer). The inner layer is positioned between the X-electrode and the Y-electrode. The inner includes thin ribs to form large air pockets between the X-electrode and the Y-electrode that increase a detection distance of the capacitive sensor. The outer layer has a high rubber content to provide protection to the capacitive sensor. In some examples, the outer layer is formed using an induction heated mold tool. Additionally or alternatively, the capacitive sensor may also be used within a vehicle bumper.

Turning to the figures, FIG. 1 illustrates an example vehicle 100 in accordance with the teachings herein. The vehicle 100 may be a standard gasoline powered vehicle, a hybrid vehicle, an electric vehicle, a fuel cell vehicle, and/or any other mobility implement type of vehicle. The vehicle 100 includes parts related to mobility, such as a powertrain with an engine, a transmission, a suspension, a driveshaft, and/or wheels, etc. The vehicle 100 may be non-autonomous, semi-autonomous (e.g., some routine motive functions controlled by the vehicle 100), or autonomous (e.g., motive functions are controlled by the vehicle 100 without direct driver input). In the illustrated example, the vehicle 100 includes a body 102, one or more doors 104, a trunk door 106, bumpers 107, a proximity sensor 108, a door motor 110, a door control unit 112, and a body control module 114.

In the illustrated example, the body 102 includes one or more panels (e.g., front side panels, rear side panels, door panels, etc.) to define an exterior of the vehicle 100. The body 102 also defines a passenger cabin in which an operator (e.g., a driver) and/or passenger(s) are positioned while the vehicle 100 is moving. Further, the doors 104 enable user(s) to enter, exit, and/or access the passenger cabin of the vehicle 100. The trunk door 106 enables a user to access a trunk and/or other cabin of the vehicle 100. In the illustrated example, the trunk door 106 is a trunk lid. In other examples, the trunk door 106 may be a tailgate or a liftgate. Further, the bumpers 107 include a front bumper and a rear bumper.

As illustrated in FIG. 1, the proximity sensor 108 is located along an exterior of the vehicle 100 to detect object(s) within a surrounding area of the vehicle 100. For example, the proximity sensor 108 is configured to detect a presence of, location of, and/or proximity to object(s) near the vehicle 100. In the illustrated example, a door 104a includes the proximity sensor 108 to detect a proximity of a nearby object to the door 104a. Additionally or alternatively, one or more others of the doors 104 of the vehicle 100 includes a proximity sensor that is identical and/or substantially similar to the proximity sensor 108. In some examples, the trunk door 106 includes a proximity sensor (i.e., identical and/or substantially similar to the proximity sensor 108) to detect a proximity of a nearby object with respect to the trunk door 106. Further, in some examples, a proximity sensor (i.e., identical and/or substantially similar to the proximity sensor 108) is positioned within and/or along other portions of the body 102 of the vehicle 100 (e.g., along a front, a rear, a front side panel, a rear side panel, a front bumper, a rear bumper, etc.) and/or one or more of the bumpers 107 to monitor for object(s) near those portions of the vehicle 100.

In the illustrated example, the door motor 110 is configured to open and/or close the door 104a in an automated manner. That is, the door motor 110 provides mechanical force to open and/or close the door 104a. In other words, the door motor 110 enables the door 104a to be opened and/or closed without a user providing the requisite mechanical force. In the illustrated example, the door motor 110 is located near a door hinge to enable the door motor 110 to open and/or close the door 104a. In examples in which one or more of the other doors 104 and/or the trunk door 106 include a proximity sensor, a door motor (i.e., identical and/or substantially similar to the door motor 110) is located near a corresponding door hinge to facilitate opening and/or closing of the doors 104 and/or the trunk door 106.

In some examples, the door motor 110 opens and/or closes the door 104a upon receipt of a request from a user to do so (e.g., via a button on a door panel, a center console, a key fob, etc.). Additionally or alternatively, the door motor 110 opens and/or closes the door 104a upon detection that a user will enter and/or exit the cabin of the vehicle 100 within a short period of time (e.g., as part of a passive-entry passive-start system).

In the illustrated example, the door control unit 112 controls operation of the door motor 110. The door control unit 112 and the body control module 114 are electronic control units (ECUs) of the vehicle 100. The ECUs are configured to monitor and control subsystems of the vehicle 100. For example, the ECUs are discrete sets of electronics that include their own circuit(s) (e.g., integrated circuits, microprocessors, memory, storage, etc.) and firmware, sensors, actuators, and/or mounting hardware. In some examples, he ECUs communicate and exchange information via a vehicle data bus. Additionally, the ECUs may communicate properties (e.g., status of the ECUs, sensor readings, control state, error and diagnostic codes, etc.) to and/or receive requests from each other. For example, the vehicle 100 may have dozens of ECUs that are positioned in various locations around the vehicle 100.

The door control unit 112 of the illustrated example controls one or more electrical systems located on doors of the vehicle 100, such as power windows, power locks, power mirrors, mirror heating elements, etc. For example, the door control unit 112 includes circuits that drive one or more of relays brushed direct current (DC) motors (e.g., to control power seats, power locks, power windows, etc.), stepper motors, LEDs, etc. In the illustrated example, the door control unit 112 is communicatively coupled to the door motor 110 to control actuation of the door motor 110. Further, the door control unit 112 is communicatively coupled to the proximity sensor 108 of the door 104a to determine when and/or how close an object is near the door 104a. For example, when the door motor 110 is opening the door 104a, the door control unit 112 instructs the door motor 110 to stop opening of the door 104a in response to the proximity sensor 108 detecting that the door 104a is near (e.g., within a predetermined distance of) an object. That is, the door control unit 112 collects information from the proximity sensor 108 to prevent the door motor 110 from opening the door 104a into an object. Further, the door control unit 112 is communicatively coupled to a door motor and/or a proximity sensor of one or more of the other doors 104 and/or the trunk door 106 to prevent the other doors 104 and/or the trunk door 106 from being autonomously opened into a nearby object.

Further, the body control module 114 of the illustrated example controls one or more subsystems throughout the vehicle 100, such as an immobilizer system, an HVAC system, etc. For example, the body control module 114 includes circuits that drive one or more of relays (e.g., to control wiper fluid, etc.), brushed direct current (DC) motors (e.g., to control wipers, etc.), stepper motors, LEDs, etc. In the illustrated example, the body control module 114 is configured to be communicatively coupled to one or more proximity sensors (e.g., the proximity sensor 108) positioned along an exterior of the body 102 of the vehicle 100. For example, the body control module 114 is communicatively coupled to proximity sensors located on one or more of the doors 104, the trunk door 106, and/or other portions of the body 102 of the vehicle 100 to facilitate control of other automated features of the vehicle 100.

Figure 2:
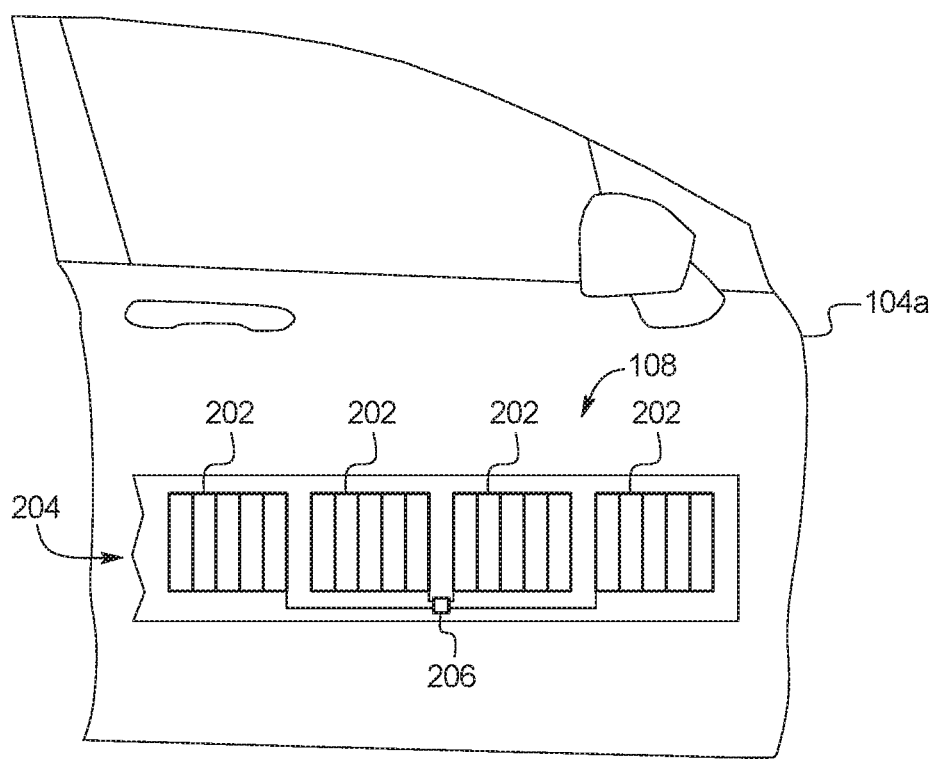
FIG. 2 illustrates a door of the vehicle of FIG. 1 having capacitive sensors.

FIG. 2 further illustrates the door 104a of the vehicle 100 that includes the proximity sensor 108. In the illustrated example, the proximity sensor 108 includes one or more capacitive sensors 202 (also referred to as capacitive proximity sensors).

Each of the capacitive sensors 202 of the illustrated example emit an electric field (e.g., an electric field 306 of FIG. 4) and measure a capacitance corresponding with the electric field. When an object (e.g., a grounded object, an ungrounded object, a person, another vehicle, a wall, etc.) is positioned within an electric field of one of the capacitive sensors 202, the corresponding one of the capacitive sensors 202 detects a change in capacitance. For example, an object may enter an electric field of one of the capacitive sensors 202 as the object approaches the door 104a and/or the door 104a is opened toward the object (e.g., via the door motor 110). Likewise, when an object is removed from the electric field, the corresponding one of the capacitive sensors 202 detects a decrease in capacitance. That is, the electric field of each of the capacitive sensors 202 defines a detection range of the corresponding one of the capacitive sensors 202. Further, the capacitive sensors 202 of the illustrated example form a grid 204 (e.g., a grid of a plurality of capacitive proximity sensors) along the door 104a to facilitate detection of an object that is near the door 104a. That is, each of the capacitive sensors 202 are located at different portions of the door 104a to enable the capacitive sensors 202 to monitor for object(s) near each of those portions of the door 104a.

As illustrated in FIG. 2, each of the capacitive sensors 202 are electrically and communicatively coupled to a capacitive module 206. For example, the capacitive module 206 detects whether an object is near the door 104a based upon the capacitive measurements of the capacitive sensors 202. Further, the capacitive module 206 is configured to determine a distance to an object based upon the capacitive measurements of the capacitive sensors 202. For example, the capacitive module 206 determines that an object is far away from the door 104a when the capacitive sensors 202 measure a low capacitance and/or determines that an object is near the door 104a when one or more of the capacitive sensors 202 measure a high capacitance. In some examples, the capacitive module 206 of the door 104a is communicatively coupled (e.g., via a wired and/or wireless connection) to the door control unit 112 of the vehicle 100. For example, if the door control unit 112 is in the process of opening the door 104a via the door motor 110, the door control unit 112 stops the door 104a from opening any farther in response to the capacitive module 206 identifying that the door 104a is within a predetermined threshold of a detected object.

Figure 3:
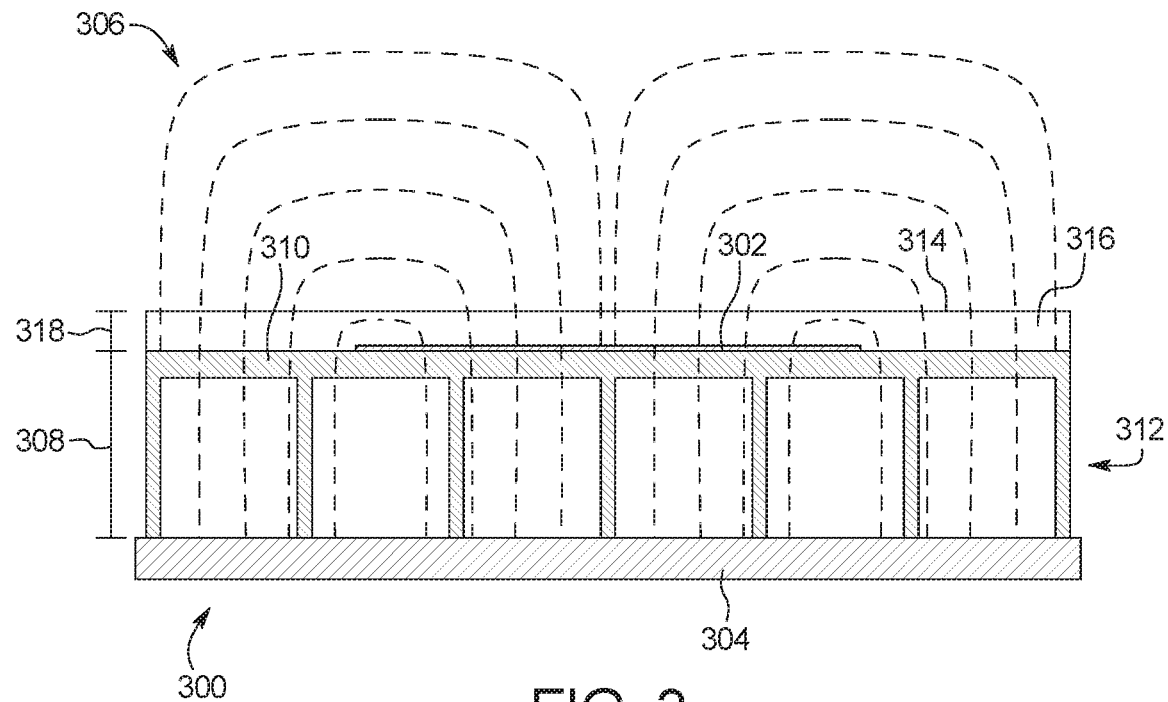
FIG. 3 depicts a cross-section of a capacitive sensor of the vehicle of FIG. 1.

FIG. 3 depicts a cross-section of an example capacitive sensor 300. For example, the capacitive sensor 300 is one of the capacitive sensors 202 of the door 104a. As illustrated in FIG. 3, the capacitive sensor 300 includes a receiving layer 302 (also referred to as a Y layer, a y-sense layer, and a y-electrode layer). For example, the receiving layer 302 is a conductive wire. Further, the capacitive sensor 300 of the illustrated example includes a transmitting layer (also referred to as an X layer, an x-sense layer, and an x-electrode layer) that is formed of sheet metal 304. That is, the sheet metal 304 that provides rigidity to the door 104a also functions as the transmitting layer of the capacitive sensor 300.

The capacitive sensor 300 of the illustrated example is a mutual-transverse coupling capacitance between a receiving layer and a transmitting layer to detect a presence of an object within an electric field emitted by the receiving layer. In the illustrated example, a mutual capacitance is measured between the receiving layer 302 and the sheet metal 304 to detect the presence of an object within an electric field 306 emitted by the receiving layer 302 of the capacitive sensor 300. For example, the capacitive module 206 measures the mutual capacitance of the capacitive sensor by identifying a time to drain the voltage to zero of a fixed sampling capacitor in the module generated by a voltage change between the receiving layer 302 and the sheet metal 304.

Additionally, the capacitive sensor 300 of the illustrated example is a flooded-x capacitive sensor. A flooded-x capacitive has a receiving layer and a transmitting layer positioned on two different planes that are spaced apart from each other to enable an electric field to be formed between the receiving layer and the transmitting layer. In the illustrated example, the receiving layer 302 of the capacitive sensor 300 is located along a plane that is substantially parallel to a plane along which the sheet metal 304 is located. Additionally, the receiving layer 302 and the sheet metal 304 of the capacitive sensor 300 are spaced apart by a distance 308 via a low dielectric layer 310 that is positioned between receiving layer 302 and the sheet metal 304. That is, the low dielectric layer 310 is positioned between the receiving layer 302 and the sheet metal 304 to separate the receiving layer 302 from the sheet metal 304 by the distance 308. Further. The low dielectric layer 310 defines air pockets 312 that are positioned between the receiving layer 302 and the sheet metal 304.

In the illustrated example, the distance 308 and dielectric constants of the low dielectric layer 310 and the air pockets 312 affect a sensitivity factor of the capacitive sensor 300. In other words, the distance 308 and the dielectric constants of the low dielectric layer 310 and the air pockets 312 define the sensitivity of the capacitive sensor 300. The sensitivity factor of a flooded-x, mutual-capacitance sensor is defined by the following equation:

$$S = \frac{\varepsilon_t}{t} \qquad \text{Equation 1}$$

In Equation 1 provided above, S represents the sensitivity factor in a direction, t represents a distance between the transmitting and receiving layers, and $\varepsilon_r$ represents the dielectric constant of the material between the transmitting and receiving layers. Further, when multiple layers of material are positioned between the transmitting and receiving layers, such as the low dielectric layer 310 and the air pockets 312, the sensitivity factor of the flooded-x, mutual-capacitance sensor is defined by the following equation:

$$\frac{1}{S_S} = \sum_{i=1}^{n} \frac{1}{S_n} \qquad \text{Equation 2}$$

In Equation 2 provided above, $S_S$ represents a total sensitivity factor, n represents a number of layers, and $S_n$ represents a sensitivity factor of a particular layer.

In the illustrated example, the dielectric constant of the low dielectric layer 310 has a substantially low value (e.g., a dielectric constant of 12 or less). In turn, the capacitive sensor 300 has reduced sensitivity. In some examples, sensitivity is further reduced as the number of different layers increases. For example, the low dielectric layer 310 is formed from materials identified in Table 1 provided below:

TABLE 1

| Material | Dielectric Constant |
| --- | --- |
| Glass | 3.7 to 10 |
| Sapphire Glass | 9 to 11 |
| Mica | 4 to 8 |
| Nylon | 3 |
| Silicon | 11 to 12 |
| Silicon Rubber | 3.2 to 9.8 |
| Silicon Molding Compound | 3.7 |
| Paper | 2 |
| Plexiglas | 3.4 |
| Polycarbonate | 2.9 to 3.0 |
| Polyethylene | 2.2 to 2.4 |
| Polystyrene | 2.56 |
| PET (polyethylene terephthalate) | 3 |
| Pyrex Glass | 4.3 to 5.0 |
| Quartz | 4.2 to 4.4 |
| Rubber | 3 |
| FR4 (glass fiber + epoxy) | 4.2 |
| PMMA (polymethyl methacrylate) | 2.6 to 4 |
| PSA (pressure sensitive adhesive) | 2.5 to 2.7 |

In the illustrated example, the distance 308 between the receiving layer 302 and the sheet metal 304 is significantly great and the dielectric constant of the low dielectric layer 310 is significantly low to increase a detection range of a portion of the electric field 306 of the capacitive sensor 300 that extends in a direction beyond an outer surface 314 of the door 104a of the vehicle 100. The detection range of the capacitive sensor 300 is increased to facilitate detection of objects that are near the outer surface 314 of the door 104a of the vehicle 100. A detection range of an electric field of a capacitive sensor has an inverse relationship with the sensitivity factor of the electric field of the capacitive sensor. That is, a smaller electric field is more sensitive and a larger electric field is less sensitive. By having a low dielectric constant, the low dielectric layer 310 causes the electric field 306 of the capacitive sensor 300 to have reduced sensitivity and, in turn, causes the electric field 306 to have an increased detection range that facilitates detection of objects near the outer surface 314 the door 104a of the vehicle 100. Further, the distance 308 between the receiving layer 302 and the sheet metal 304 of the capacitive sensor 300 is relatively great to facilitate detection of objects near the door 104a of the vehicle 100. That is, because a sensitivity factor has an inverse relationship with a distance between transmitting and receiving layers, the distance 308 of the capacitive sensor 300 is relatively great to reduced sensitivity and, in turn, increase a detection range of the capacitive sensor 300. For example, the distance 308 between the receiving layer 302 and the sheet metal 304 is about 19.5 millimeters (0.77 inches).

Further, as illustrated in FIG. 3, an outer surface layer 316 covers the receiving layer 302 such that the receiving layer 302 is positioned between the outer surface layer 316 and the low dielectric layer 310. The outer surface layer 316 is thin to enable the receiving layer 302 to be near an outer surface 314 of the door 104a and, thus, enable the receiving layer 302 to emit the electric field 306 beyond the outer surface 314 of the door 104a. Additionally, the outer surface layer 316 has a dielectric constant and a thickness 318 (e.g., about 0.5 millimeters (0.02 inches)) that increases a sensitivity factor of a portion of the electric field 306 that projects in a direction beyond the outer surface 314 of the door 104a of the vehicle 100. Further, the outer surface layer 316 is formed of durable material that protects the receiving layer 302 from damage. For example, the outer surface layer 316 includes rubber, thermoplastic olefin (TPO), and/or other material(s) having high durability and dielectric constant(s) (e.g., a dielectric constant of between 3 and 15) that increases the sensitivity factor of the portion of the electric field 306 projecting beyond the outer surface 314 of the door 104a. In some examples, an induction tool is heated to cause the material of the outer surface layer 316 to form (e.g., flow) over the receiving layer 302.

Figure 4:
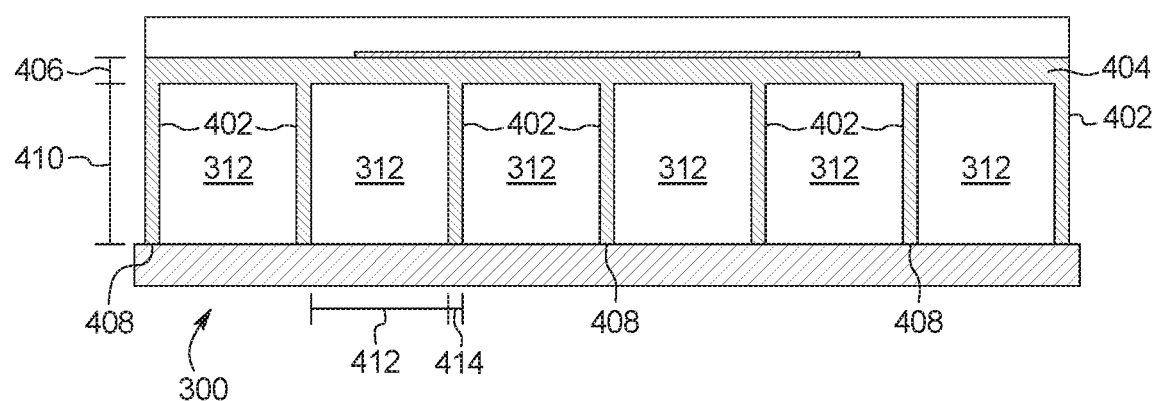
FIG. 4 further depicts the cross-section of the capacitive sensor of FIG. 3.

FIG. 4 further depicts the cross-section of the capacitive sensor 300. As illustrated in FIG. 4, the low dielectric layer 310 includes ribs 402 that define the air pockets 312 between the receiving layer 302 and the sheet metal 304. The ribs 402 extend in a direction between the receiving layer 302 and the sheet metal 304. In the illustrated example, the ribs 402 extend from a base 404 of the low dielectric layer 310. The base 404 has a thickness 406 (e.g., about 0.5 millimeters (0.02 inches)) and engages the receiving layer 302. The ribs 402 extend from the base 404 and include distal ends 408 that contact the sheet metal 304. Further, the ribs 402 of the illustrated example have a length 410 of about 19 millimeters (0.75 inches) such that the receiving layer 302 and the sheet metal 304 are spaced apart by about 19.5 millimeters (0.77 inches).

The ribs 402 reduce an amount of material of the low dielectric layer 310 utilized to space apart the receiving layer 302 and the sheet metal 304, thereby reducing a weight of the door 104a and/or manufacturing costs of the door 104a. Further, the air pockets 312 defined by the ribs 402 reduce conductivity between the receiving layer 302 and the sheet metal 304 to increase the detection range of the capacitive sensor 300. In the illustrated example, the air pockets has a thickness 412 that are defined by a distance between the ribs 402. For example, the thickness 412 of one or more of the air pockets 312 is about 5 millimeters (0.20 inches). The ribs 402 of the illustrated example also reduce conductivity between the receiving layer 302 and the sheet metal 304 by reducing a contact surface area between the low dielectric layer 310 and the sheet metal 304. For example, one or more of the ribs 402 have a thickness 414 of about 1 millimeter (0.04 inches).

Figure 5:
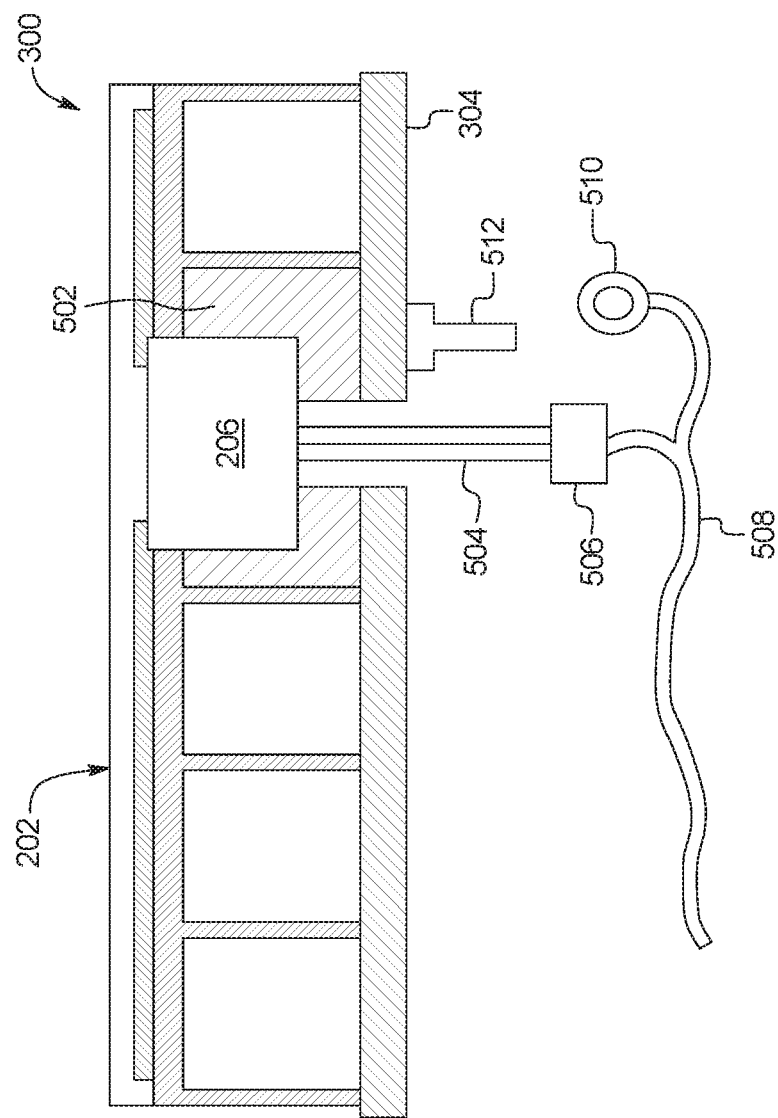
FIG. 5 depicts a schematic of capacitive sensors of the vehicle of FIG. 1.

FIG. 5 depicts a schematic of some of the capacitive sensors 202 of the door 104a of the vehicle 100. In the illustrated example, the schematic depicts the capacitive sensor 300 and another one of the capacitive sensors 202 of the door 104*a*. The capacitive module 206 of the illustrated example is sealed within an overmold 502 (e.g., a silicone overmold). Additionally, the capacitive module 206 is grounded via pins 504, a harness connector 506, wiring 508, a wiring eyelet 510, and a stud 512 (e.g., a weld stud). The stud 512 is welded to the sheet metal 304 that is grounded. The harness connector 506 electrically couples to the capacitive module 206 via the pins 504. Further, the harness connector 506 electrically couples to the stud 512 via the wiring 508 and the wiring eyelet 510 formed at the end of the wiring 508 that connects to the stud 512 (e.g., via soldering).

The capacitive module 206 of the illustrated example is located near the stud 512 to which it is grounded to reduce noise and, thus, maintain accuracy of the capacitive measurements of the capacitive sensors 202. That is, the distance between the capacitive module 206 and ground is reduced to reduce the effect of noise on the capacitive measurements. Further, the capacitive module 206 is centrally located with respect to the capacitive sensors 202 of the door 104*a* to reduce the effect of noise on the capacitive measurements of the capacitive sensors 202. For example, the capacitive module 206 is positioned between the capacitive sensor 300 and another one of the capacitive sensors 202. By positioning the capacitive module 206 with respect to the door 104*a*, the amount of flexing that the wiring 508 and/or other electronic components undergoes when an object collides with the door 104*a* is reduced. In turn, the amount of noise that results from a collision with the door 104*a* is reduced. Additionally, the capacitive module 206 is sealed within the overmold 502 to further reduce an effect of noise on the capacitive measurements of the capacitive sensors 202.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects. Further, the conjunction "or" may be used to convey features that are simultaneously present instead of mutually exclusive alternatives. In other words, the conjunction "or" should be understood to include "and/or". The terms "includes," "including," and "include" are inclusive and have the same scope as "comprises," "comprising," and "comprise" respectively. Additionally, as used herein, the terms "module" and "unit" refer to hardware with circuitry to provide communication, control and/or monitoring capabilities, often in conjunction with sensors. A "module" and a "unit" may also include firmware that executes on the circuitry.

The above-described embodiments, and particularly any "preferred" embodiments, are possible examples of implementations and merely set forth for a clear understanding of the principles of the invention. Many variations and modifications may be made to the above-described embodiment(s) without substantially departing from the spirit and principles of the techniques described herein. All modifications are intended to be included herein within the scope of this disclosure and protected by the following claims.

What is claimed is:

1. A vehicle comprising:
    a door including:
        an outer surface layer;
        sheet metal for providing rigidity;
        a low dielectric layer; and
        a capacitive sensor including:
            a receiving layer positioned between the outer surface layer and the low dielectric layer; and
            the sheet metal that functions as a transmitting layer,
            wherein the low dielectric layer separates the receiving layer and the sheet metal,
            wherein the low dielectric layer includes ribs that define air pockets positioned between the receiving layer and the sheet metal.

2. The vehicle of claim 1, wherein the sheet metal of the door is grounded.

3. The vehicle of claim 1, wherein a detection range of the capacitive sensor corresponds with a distance between the receiving layer and the sheet metal.

4. The vehicle of claim 1, further including:
    a door motor for opening and closing the door; and
    a door control unit for controlling actuation of the door motor.

5. The vehicle of claim 4, wherein the door control unit is configured to stop opening of the door in response to the capacitive sensor detecting an object near the door.

6. A door of a vehicle comprising:
    an outer surface layer;
    sheet metal for providing rigidity;
    a low dielectric layer; and
    a capacitive proximity sensor including:
        a receiving layer positioned between the outer surface layer and the low dielectric layer; and
        the sheet metal that functions as a transmitting layer,
        wherein the low dielectric layer separates the receiving layer and the sheet metal,
        wherein the low dielectric layer includes ribs that define air pockets positioned between the receiving layer and the sheet metal.

7. The door of claim 6, wherein the outer surface layer is a thin layer of high dielectric material that increases a sensitivity factor of an electric field of the receiving layer.

8. The door of claim 6, wherein the outer surface layer includes rubber to protect the receiving layer of the capacitive proximity sensor from damage.

9. The door of claim 6, wherein the outer surface layer is a thermoplastic olefin layer.

10. The door of claim 6, wherein the sheet metal is grounded.

11. The door of claim 6, wherein a detection range of the capacitive proximity sensor corresponds with a distance between the receiving layer and the sheet metal.

12. The door of claim 6, wherein the ribs extend in a direction between the receiving layer and the sheet metal.

13. The door of claim 6, wherein the ribs reduce an amount of material of the low dielectric layer utilized to space apart the receiving layer and the sheet metal.

14. The door of claim 6, wherein the air pockets defined by the ribs reduce conductivity between the receiving layer and the sheet metal.

15. The door of claim 6, wherein the ribs include distal ends that contact the sheet metal to reduce conductivity between the receiving layer and the sheet metal by reducing a contact surface area between the low dielectric layer and the sheet metal.

16. The door of claim 6, further including a grid of a plurality of capacitive proximity sensors to facilitate detection of a nearby object.

17. The door of claim 16, further including a capacitive module that is electrically coupled to each of the plurality of capacitive proximity sensors.

18. The door of claim 17, wherein the capacitive module is grounded to a weld stud coupled to the sheet metal to reduce an effect of noise on the plurality of capacitive proximity sensors.

* * * * *